(12) United States Patent
Feng

(10) Patent No.: US 7,297,589 B2
(45) Date of Patent: Nov. 20, 2007

(54) TRANSISTOR DEVICE AND METHOD

(75) Inventor: Milton Feng, Champaign, IL (US)

(73) Assignee: The Board of Trustees of The University of Illinois, Urbana, IL (US)

( * ) Notice: Subject to any disclaimer, the term of this patent is extended or adjusted under 35 U.S.C. 154(b) by 18 days.

(21) Appl. No.: 11/102,594

(22) Filed: Apr. 8, 2005

(65) Prior Publication Data
US 2006/0226444 A1 Oct. 12, 2006

(51) Int. Cl.
*H01L 21/8249* (2006.01)

(52) U.S. Cl. ............................ 438/235; 257/E21.093; 257/E21.188; 257/E21.371; 257/E21.387; 438/47; 438/94; 438/172; 438/191; 438/312

(58) Field of Classification Search ........ 257/E21.093, 257/E21.188, E21.371, E21.387; 438/47, 438/94, 172, 191, 235, 312, FOR. 179
See application file for complete search history.

(56) References Cited

U.S. PATENT DOCUMENTS

| | | | | |
|---|---|---|---|---|
| 2,569,347 A | | 9/1951 | Shockley | 332/52 |
| 2,981,877 A | | 4/1961 | Noyce | |
| 3,138,743 A | | 6/1964 | Kilby | |
| 4,827,320 A | | 5/1989 | Morkoc et al. | 357/22 |
| 5,283,448 A | * | 2/1994 | Bayraktaroglu | 257/194 |
| 6,667,498 B2 | * | 12/2003 | Makimoto et al. | 257/183 |
| 6,696,710 B2 | * | 2/2004 | Moll et al. | 257/190 |
| 6,765,242 B1 | * | 7/2004 | Chang et al. | 257/197 |
| 6,797,996 B1 | * | 9/2004 | Hikita et al. | 257/197 |
| 6,806,513 B2 | * | 10/2004 | Chau et al. | 257/198 |
| 7,091,082 B2 | * | 8/2006 | Feng et al. | 438/235 |
| 2002/0195619 A1 | * | 12/2002 | Makimoto et al. | 257/197 |
| 2004/0065898 A1 | * | 4/2004 | Chau et al. | 257/197 |
| 2004/0124435 A1 | * | 7/2004 | D'Evelyn et al. | 257/103 |
| 2005/0040387 A1 | * | 2/2005 | Feng et al. | 257/14 |
| 2005/0054172 A1 | * | 3/2005 | Feng et al. | 438/313 |
| 2005/0067629 A1 | * | 3/2005 | Woodall et al. | 257/101 |
| 2005/0139863 A1 | * | 6/2005 | Welser et al. | 257/197 |
| 2006/0186420 A1 | * | 8/2006 | Hirukawa et al. | 257/82 |
| 2006/0208290 A1 | * | 9/2006 | Feng et al. | 257/292 |

OTHER PUBLICATIONS

J. Bardeen and W.H. Brattain, "The Transistor, A Semi-conductor Triode," Physical Review 74, 230-234 (1948).
W. Shockley, "The Theory of p-n Junctions in Semiconductors and p-n Junction Transistors," Bell System Technology Journal 28, 435-489 (1949).
J. Kroemer, "Theory Of A Wide-Gap Emitter For Transistors," Proceedings of the IRE 45, 1535-1537 (1957).

(Continued)

*Primary Examiner*—Michelle Estrada
*Assistant Examiner*—Jarrett J Stark
(74) *Attorney, Agent, or Firm*—Martin Novack

(57) ABSTRACT

A method for making a heterojunction bipolar transistor includes the following steps: forming a heterojunction bipolar transistor by depositing, on a substrate, subcollector, collector, base, and emitter regions of semiconductor material; the step of depositing the subcollector region including depositing a material composition transition from a relatively larger bandgap material nearer the substrate to a relatively smaller bandgap material adjacent the collector; and the step of depositing the collector region including depositing a material composition transition from a relatively smaller bandgap material adjacent the subcollector to a relatively larger bandgap material adjacent the base.

21 Claims, 8 Drawing Sheets

OTHER PUBLICATIONS

W. Hafez, J.W. Lai and M. Feng, Elec. Lett. 39, No. 20, 1475 (2003).

M. Feng, W. Hafez, and J.W. Lai, Proceedings of IPRM, 653-658 (2004).

J.-S. Rieh, B. Jagannathan, H. Chen, K. Schonenberg, S.-J. Jeng, M. Khater, D. Ahlgren, G. Freeman, and S. Subbanna, Proceedings of IPRM, 374-377 (2003).

M. Ida, k. Kurishima, K. Ishii, and N. Watanabe, Proceedings GaAs IC Symposium, 2003. 25th Annual Technical Digest, 211-214 (2003).

B.F. Chu-Kung and M. Feng, Elect. Lett. 40 (20), 1305 (2004).

c. Bolognesi, M. W. Dvorak, N. Matine, O. J. Pitts, and S. P. Watkins, Jpn. J. Appl. Phys 41 (2B), 1131-1135 (2002).

M. Feng, N. Holonyak, Jr. and W. Hafez, "Light-Emitting Transistor: : Light Emission From InGaP/GaAs Heterojunction Bipolar Transistors", Appl. Phys. Lett. 84, 151, Jan. 5, 2004.

M. Feng, N. Holonyak Jr., and R. Chan "Quantum-Well-Base Heterojunction Bipolar Light-Emitting Transistor", App. Phys. Lett., vol. 84, No. 1, (Mar. 2004).

G. Walter, N. Holonyak, Jr., M. Feng, and R. Chan "Laser Operation Of A Heterojunction Bipolar Light-Emitting Transistor", App. Phys. Lett., vol. 85, No. 20 (Nov. 2004).

W. Hafez and M. Feng, IEEE Electronics Lett. 40 (18), 1151 (2004).

W. Hafez, J.W. Lai, and M. Feng. "Sub-micron InP/InGaAs Single Heterojunction Bipolar Transistor With $f_T$ of 377 GHz," IEEE Electron Device Letters, May 2003.

Y. Yamashita, A. Endoh, K. Shinohara, K. Hikosaka, T. Matsui, S. Hiyamizu, and T. Mimura, IEEE Electron Device Lett. 23 (10), 573-575 (2002).

W. Hafez, R. Eden, F. Dixon, and M. Feng. 2004 CS MANTECH Conf. Dig. Of Papers, 269-272 (2004).

W. Hafez, J.W. Lai and M. Feng, "InP/InGaAs SHBTs with 75 nm Collector and fr>500 GHz", Electronic Letters, vol. 39, No. 20, Oct. 2003.

W. Hafez, J.W. Lai, and M. Feng "Record $f_T$ and $f_T + f_{MAX}$ Performance of InP/InGaAs Single Heterojunction Bipolar Transistors," Electronics Letters, May 2003.

J. Hu et al., "Type II Photoluminescence And Conduction Band Offsets of GaAsSb/InGaAs and GaAsSb/InP Heterostructures Grown By Metalorganic Vapor Phase Epitaxy", Applied Physics letters, 73(19) Nov. 1998.

W. Hafez, J.W. Lai and M. Feng, "Vertical Scaling of 0.25 um Emitter InP/InGaAs Single Heterojunction Bipolar Transistors With $f_T$ of 452 GHz," IEEE Electron Devices Letters, Jul. 2003.

Y. Yamashita, A. Endoh, K. Shinohara, K. Hikosaka, T. Matsui, S. Hiyamizu, and T. Mimura, IEEE Electron Device Lett. 23 (10), 573-575 (2002).

* cited by examiner

TRANSISTOR DEVICE AND METHOD

FIELD OF THE INVENTION

This invention relates to semiconductor devices and methods and, more particularly, to an improved heterojunction bipolar transistor and a method of making same, and also to an improved heterojunction bipolar light-emitting transistor, all capable of operating at extremely high frequencies.

BACKGROUND OF THE INVENTION

Following Bardeen's and Brattain's discovery of the transistor (J. Bardeen and W. H. Brattain, Phys. Rev. 74, 230 (1948)) and the identification of minority carrier injection and collection as the physical principle underlying transistor action, followed by Shockley's development of PN junction theory and junction transistors (W. Shockley, Bell System Technology Journal 28, 435 (1949)), the transistor and the development of integrated circuits (J. S. Kilby, U.S. Pat. No. 3,138,743; R. N. Noyce, U.S. Pat. No. 2,981,877) have revolutionized the military and consumer electronic industries. The concept of a wide band-gap semiconductor emitter (W. Shockley, U.S. Pat. No. 2,569,347; H. Kroemer, Proceedings of the IRE 45, 1535 (1957)) has been used to achieve high minority carrier injection efficiency in a heterojunction bipolar transistor (HBT), with the InP material system so far demonstrating the fastest transistors, now operated at speeds ($f_T$) above 500 GHz (see W. Hafez, J. W. Lai and M. Feng, Elec. Lett. 39, No. 20, 1475 (2003); M. Feng, W. Hafez, and J. W. Lai, Proceedings of IPRM, 653-658 (2004)). Efforts to improve $f_T$ have focused, inter alia, on the reduction of electron transit time by vertically scaling the base and collector thicknesses at the cost of increasing base-collector parasitic capacitance as demonstrated in SiGe HBTs, as well as type I and type II InP DHBTs (see, for example, W. Hafez, J. W. Lai and M. Feng, Elec. Lett. 39, No. 20, 1475 (2003); M. Feng, W. Hafez, and J. W. Lai, Proceedings of IPRM, 653-658 (2004); J.-S. Rieh, B. Jagannathan, H. Chen, K. Schonenberg, S.-J. Jeng, M. Khater, D. Ahlgren, G. Freeman, and S. Subbanna, Proceedings of IPRM, 374-377 (2003); M. Ida, K. Kurishima, K. Ishii, and N. Watanabe, Proceedings GaAs IC Symposium, 2003. 25th Annual Technical Digest, 211-214 (2003); B. F. Chu-Kung and M. Feng, Elect. Lett. 40 (20), 1305 (2004); C. Bolognesi, M. W. Dvorak, N. Matine, O. J. Pitts, and S. P. Watkins, Jpn. J. Appl. Phys 41 (2B), 1131-1135 (2002)).

A graded composition base region has contributed to increased operating frequency, as described, for example, in the above referenced documents, but improvements in transistor speed, toward terahertz operation, will require further advances in transistor processing and structure. The same is also true for light emitting HBT's (see, for example M. Feng, N. Holonyak, Jr. and W. Hafez, "Light-Emitting Transistor: Light Emission From InGaP/GaAs Heterojunction Bipolar Trnsistors", App. Phys. Lett., Vol. 84, No. 1, (January 2004); M. Feng, N. Holonyak Jr., and R. Chan "Quantum-Well-Base Heterojunction Bipolar Light-Emitting Transistor", App. Phys. Lett., Vol. 84, No. 1, (March 2004); G. Walter, N. Holonyak, Jr., M. Feng, and R. Chan "Laser Operation Of A Heterojunction Bipolar Light-Emitting Transistor", App. Phys. Lett., Vol. 85, No. 20 (November 2004)), in which operation approaching terahertz frequencies will provide advantages in communications, switching, and many other commercial and military applications.

It is among the objects of the present invention to improve operating characteristics, including transistor speed, of HBTs and light emitting HBTs, and to devise methods and devices which will permit operation approaching terahertz frequencies.

SUMMARY OF THE INVENTION

Applicant has observed that the fundamental operating speed of an HBT transistor has also been limited by the lattice constant considerations and by transit time delays in the HBT subcollector and collector regions, as well as considerations of contact resistance and current density. In an embodiment of the present invention, a pseudomorphic heterojunction bipolar transistor provides advantages over prior HBTs by virtue of bandgap design in the subcollector and collector, as well as the base of the transistor. Also, subcollector contact resistance is improved by material composition transition to lower bandgap material. In one embodiment, InP, instead of InGaAs, is used in the bulk of the subcollector, leaving a relatively thin InGaAs contact layer for low resistance ohmic contacts, resulting in substantial reduction in total thermal resistance compared to prior devices. Also, a compositionally graded InGaAs to InAs emitter cap reduces emitter resistance and thus improves junction charging time.

In accordance with an embodiment of the invention, a method is set forth for making a heterojunction bipolar transistor, including the following steps: forming a heterojunction bipolar transistor by depositing, on a substrate, subcollector, collector, base, and emitter regions of semiconductor material; said step of depositing said subcollector region comprising depositing a material composition transition from a relatively larger bandgap material nearer the substrate (or lattice matched layer thereon) to a relatively smaller bandgap material adjacent the collector; and said step of depositing said collector region comprising depositing a material composition transition from a relatively smaller bandgap material adjacent the subcollector to a relatively larger bandgap material adjacent the base.

In a form of this embodiment, the step of depositing the subcollector region comprises depositing $In_xGa_{1-x}As$ having a relatively lower indium fraction nearer the substrate with transition to a relatively higher indium fraction adjacent the collector. Also in this embodiment, the step of depositing the collector region comprises depositing $In_xGa_{1-x}As$ having a relatively higher indium fraction adjacent the subcollector with transition to a relatively lower indium fraction adjacent the base. In a form of this embodiment, the substrate comprises InP and said step of depositing includes depositing said subcollector region as $In_xGa_{1-x}As$ on a heavily doped InP layer.

In another form of the invention, a heterojunction bipolar light emitting transistor, is set forth, and includes: a heterojunction bipolar structure including a substrate, subcollector, collector, base, and emitter regions of semiconductor material; said subcollector region comprising a material composition transition from a relatively larger bandgap material nearer the substrate to a relatively smaller bandgap material adjacent the collector; said collector region comprising depositing a material composition transition from a relatively smaller bandgap material adjacent the subcollector to a relatively larger bandgap material adjacent the base; and means for applying electrical signals across terminals coupled with said subcollector, base, and emitter regions to cause light emission by radiative recombination in the base region.

Further features and advantages of the invention will become more readily apparent from the following detailed description when taken in conjunction with the accompanying drawings.

DETAILED DESCRIPTION

Figure 1:
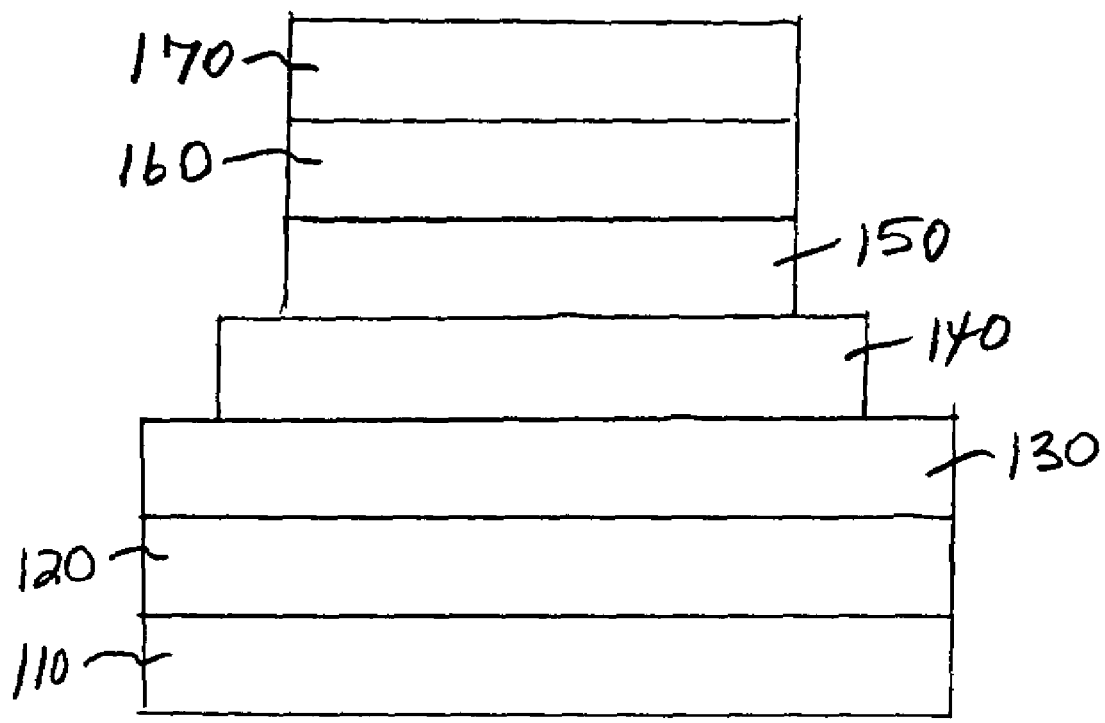
FIG. 1 is a simplified diagram, not to scale, of the epitaxial layer structure of devices in accordance with an embodiment of the invention and which can be used in practicing an embodiment of the method of the invention.
Figure 3:
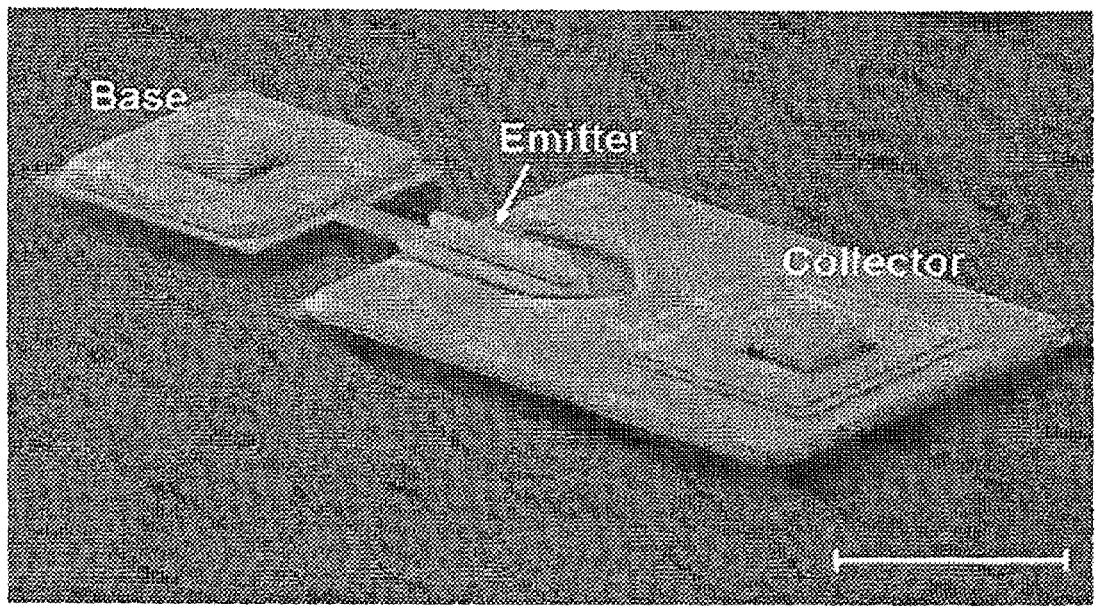
FIG. 3 is a scanning electron micrograph top view of a device in accordance with an embodiment of the invention, before passivation thereof.

FIG. 1 is a simplified diagram of the epitaxial layer structure of devices in accordance with an embodiment of the invention that were grown by molecular beam epitaxy (MBE) on semi-insulating InP substrates. It will be understood that other suitable techniques for growth, for example MOCVD, can alternatively be used. The substrate is represented at 110, and may comprise semi-insulating N+ InP. A subcollector structure 120 included a 250 nm heavily doped $N^+$ InP subcollector, a 50 nm $In_{0.53}Ga_{0.47}As$ layer, and a 10 nm strained $In_{0.63}Ga_{0.37}As$ contact layer silicon-doped to $5\times10^{19}$ $cm^{-3}$. A collector 130, lightly-doped at $3\times10^{16}$ $cm^{-3}$ to suppress Kirk effect, was then linearly graded over 62.5 nm from $In_{0.63}Ga_{0.37}As$ at the collector/subcollector interface, to $In_{0.53}Ga_{0.47}As$ (lattice-matched) at the junction with base 140. Techniques for achieving material composition transitions, continuous and/or discrete, are well known in the art. In the present embodiment, the base was 20 nm and carbon-doped ($8\times10^{19}$ $cm^{-3}$, $R_{SB}=1350$ Ω/sq.) and graded 6% indium mole-fraction to $In_{0.47}Ga_{0.53}As$ at the junction with the emitter. The emitter structure included a 35 nm InP emitter 150, a compositionally graded cap transition 160 ($In_{0.53}Ga_{0.47}As$ to InAs), and a 10 nm InAs emitter cap 170, doped to $8\times10^{19}$ $cm^{-3}$. Collector, base and emitter contacts are represented in FIG. 3 below, and in FIG. 8, described subsequently. An InAs emitter cap was employed, as it has been shown to effectively reduce the emitter contact resistance $R_{EE}$ by 50% for small-area emitters (see W. Hafez and M. Feng, IEEE Electronics Lett. 40 (18), 1151 (2004). Due to the relatively large parasitic base-to-collector capacitance associated with the vertically scaled epitaxial structure, small emitter areas are required to allow lateral device scaling to maintain respectable unity power gain ($f_{MAX}$) frequencies. Replacing InGaAs with InP in the bulk of the subcollector and leaving only a thin InGaAs contact layer for low resistance ohmic contacts results in a 15% reduction in the total thermal resistance of the device when compared with a conventional lattice-matched InGaAs subcollector.

Figure 2:
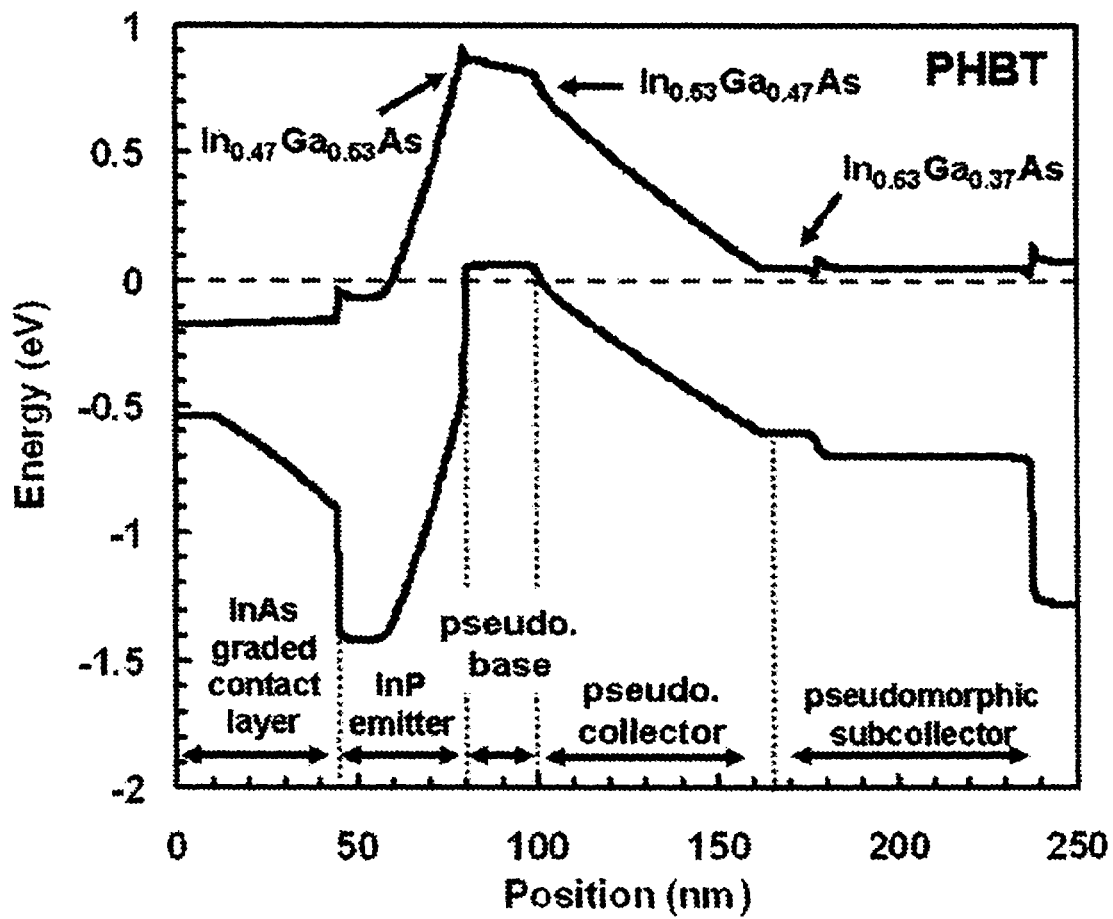
FIG. 2 is an energy band diagram of the device of FIG. 1.

FIG. 2 shows an energy-band diagram of the heterojunction (HBT) of the device of FIG. 1.

In examples of an embodiment of the invention, HBT devices were fabricated using an all wet-etch process (see for example, W. Hafez, J. W. Lai, and M. Feng, IEEE Electron Device Lett. 24 (5), 292-294 (2003)), with emitters designed to have a width of 0.5 μm after electrode evaporation. Corresponding physical emitter/base junction widths were 0.4 μm after the emitter etch, and emitter lengths range from 1 μm to 6 μm. The devices were passivated in benzocyclobutene (BCB). A scanning-electron micrograph of a device before passivation is shown in FIG. 3. The scale bar represents 5 μm.

Figure 4:
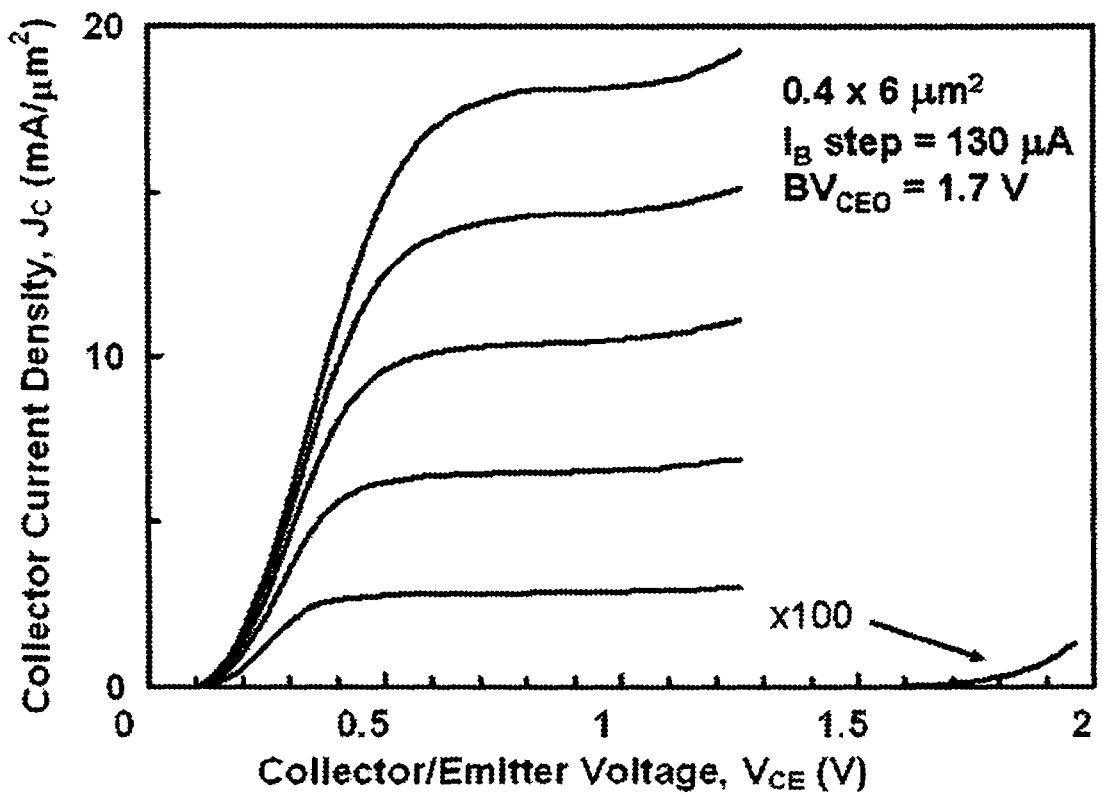
FIG. 4 shows common-emitter I-V curves for an example of a device in accordance with an embodiment of the invention.

FIG. 4 shows the common-emitter I-V curves for a 0.4×6 μm² emitter device. Measurements were taken at room temperature, and indicate $BV_{CEO}$ values of 1.7 V. Current density at peak $f_T=16.82$ mA/μm² at a $V_{CE}=0.907$ V. The knee voltage is less than 0.6 V at current densities in excess of 18 mA/μm². The output conductance is very low, exhibiting output characteristics that are superior to pseudomorphic high-electron mobility transistors (pHEMTs) with similar RF performance (see Y. Yamashita, A. Endoh, K. Shinohara, K. Hikosaka, T. Matsui, S. Hiyamizu, and T. Mimura, IEEE Electron Device Lett. 23 (10), 573-575 (2002)). The common emitter breakdown voltage, defined when the current density reaches 100 A/cm², is $BV_{CEO}=1.7$ V. Gummel characteristics exhibit peak DC gain (β) of 65 and idealities of 1.1 and 1.62 for the collector and base junctions, respectively.

Figure 5:
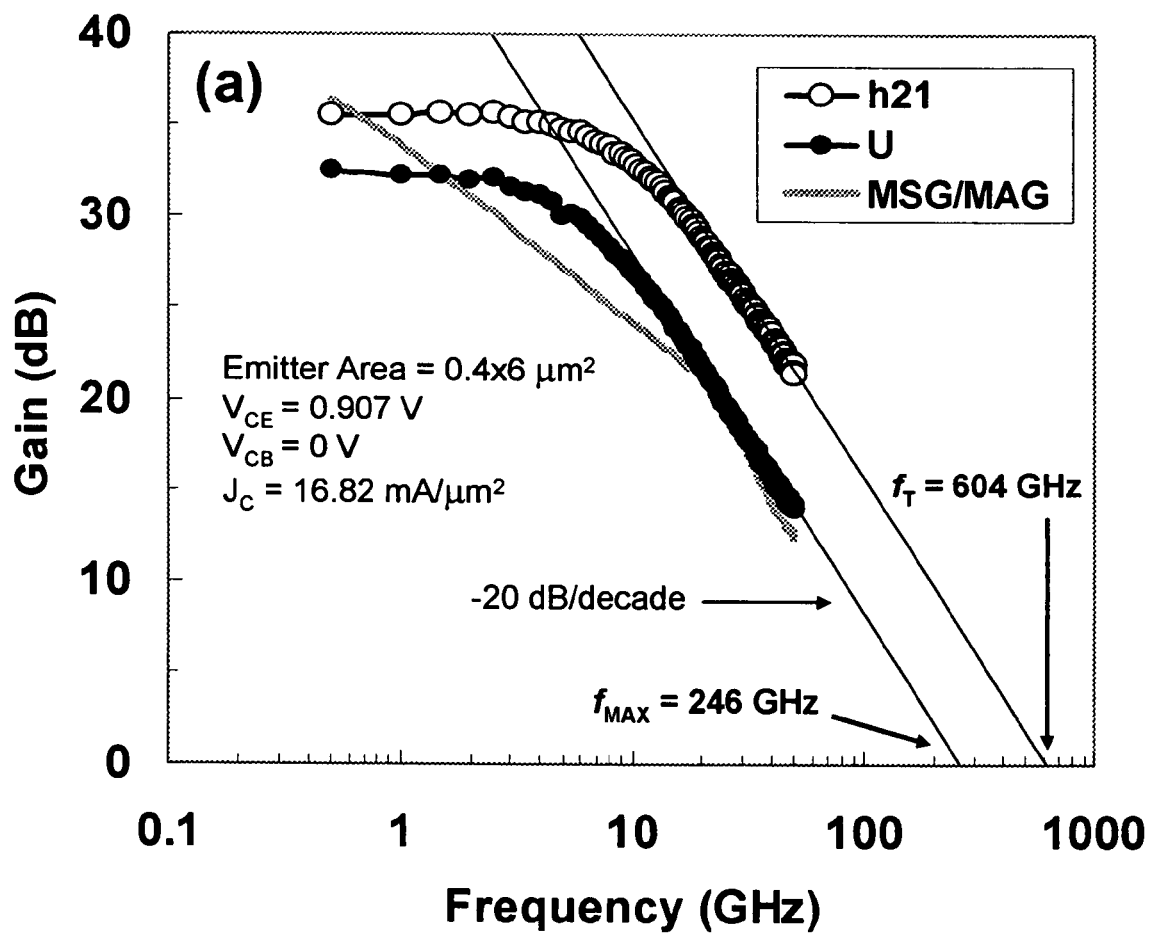
FIG. 5 shows $h_{21}$, U, and MSG/MAG for an example of a device in accordance with an embodiment of the invention, and shows extrapolations to obtain cutoff.
Figure 6:
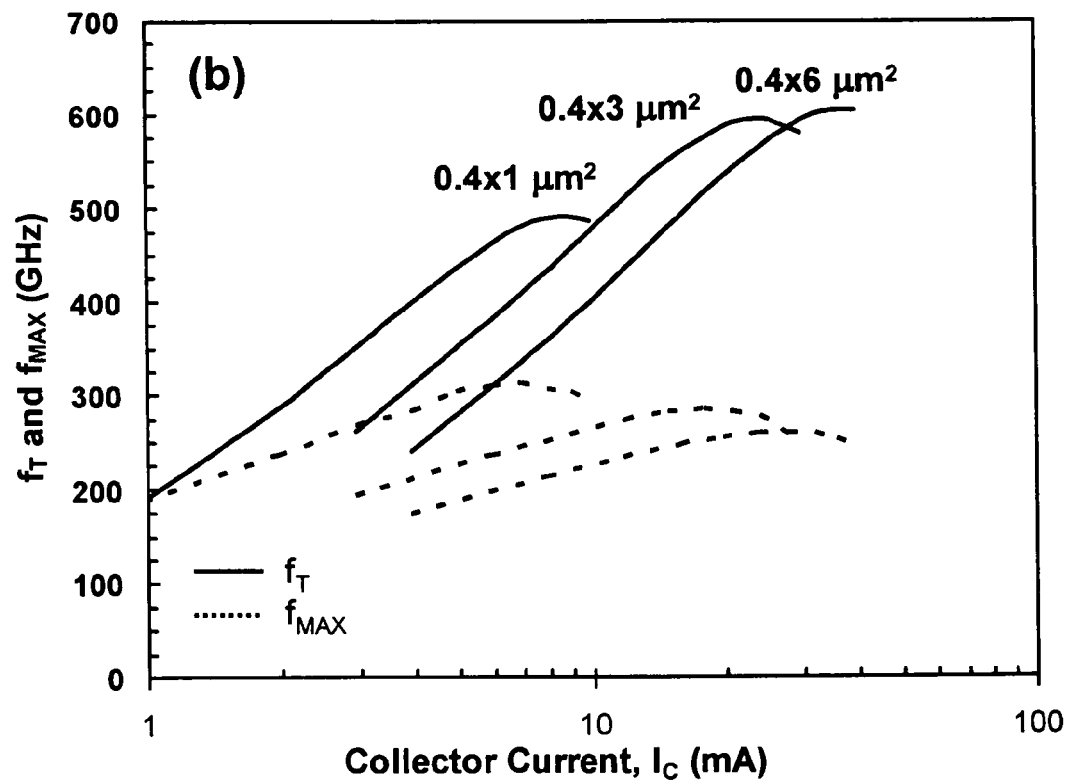
FIG. 6 shows the device cutoff frequency scalling trend for different emitter lengths of examples of devices in accordance with an embodiment of the invention.

Microwave performance at room temperature was characterized from 0.5 GHz to 50 GHz using an HP8510C network analyzer, with calibration performed using on-wafer SOLT standards. The measurement of a thru standard after calibration showed deviation of less than ±0.015 dB, assisting of verification in the accuracy of the calibration. FIG. 5 shows extrapolations of $h_{21}$ (short circuit current gain), U (ratio of output to input power), and MSG/MAG (ratio of maximum stable gain to maximum available gain) for a 0.4×6 μm² device, operating at a collector current density, $J_C$, of 16.82 mA/μm². The cutoff frequencies are extrapolated using a least-squares fit of a −20 dB/decade line, and show a peak $f_T$ (unity current gain cutoff frequency) of 604 GHz and associated $f_{MAX}$ (unity power gain cutoff frequency) of 246 GHz, respectively. To applicant's knowledge, this $f_T$ is the highest value reported for any transistor to date. Thermal resistance was calculated using an emitter thermal-shunt model (see W. Hafez, F. Dixon, and M. Feng. 2004 CS MANTECH Conf. Dig. Of Papers, 269-272 (2004)), with a 0.4×6 μm² device exhibiting a normalized thermal resistance of 9.6° C. μm²/mW, corresponding to a temperature increase of 148° C. and a power dissipation of 36 mW when biased at peak $f_T$. FIG. 6 shows the device cutoff frequency scaling trend for 0.4 μm HBTs versus emitter length, with $f_T$ remaining relatively flat for emitter lengths above 3 μm and $f_{MAX}$ monotonically increasing for shorter emitters.

Figure 7:
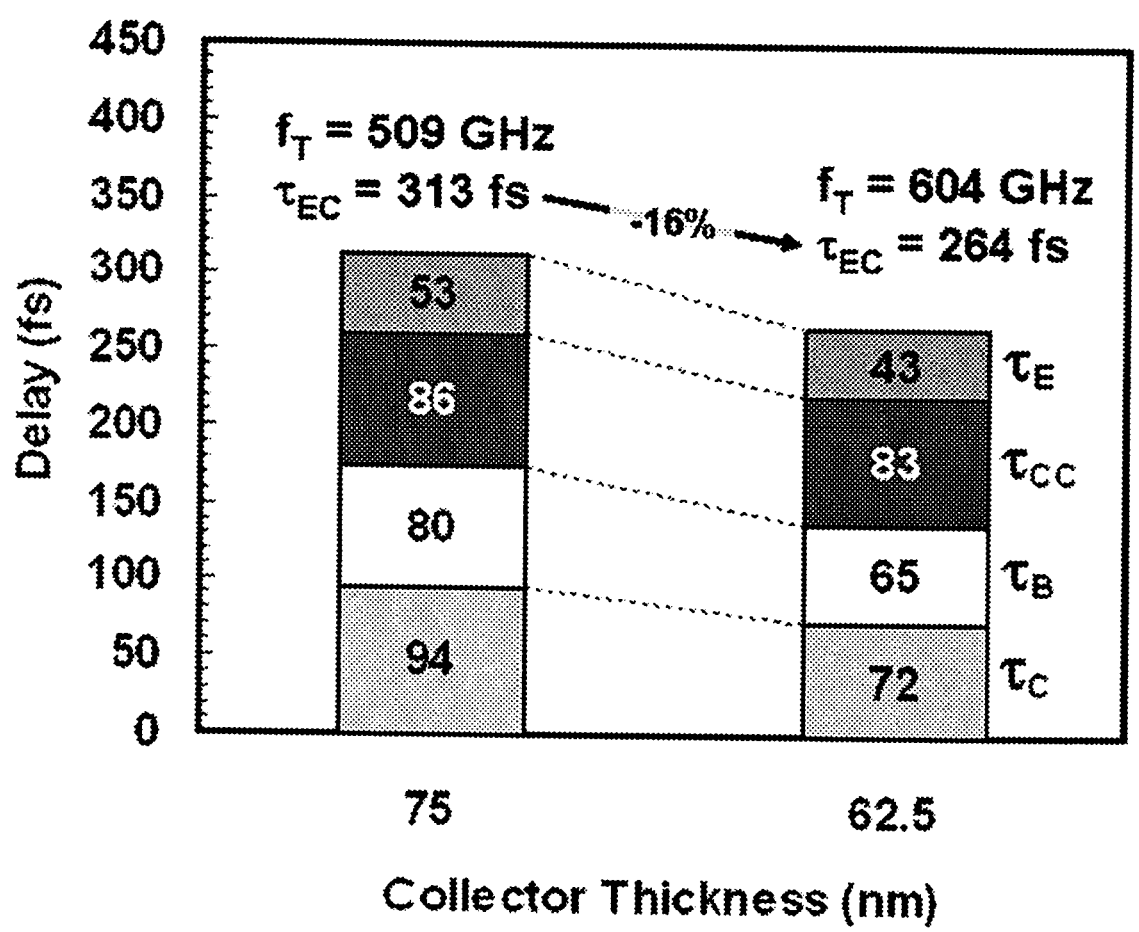
FIG. 7 shows components of delay time that affect device operating speed. Delay terms obtained from extracted device parameters show the effect of scaling between a 62.5 nm collector device hereof, and a 75 nm collector HBT. A reduction of 16% is observed in the total delay time.

Equivalent circuit parameters were extracted/optimized from measured S-parameters and device geometry for a 0.4×6 μm² HBT, where $r_E=kT/I_C$ is the dynamic emitter resistance (0.8 Ω), $R_{EE}$ is the emitter contact resistance (2.1 Ω), $R_C$ is the collector resistance (0.9 Ω), $C_{JE}$ is the emitter junction capacitance (54 fF), and $C_{BC}$ is the total base-collector capacitance (21.83 fF). The calculated delay times are shown in the bar graph of FIG. 7. The current cutoff frequency, $f_T$, for an HBT is given in Eq. (1), where $\tau_B$ and $\tau_C$ represent the base and collector transit times, $$\frac{1}{2\pi f_T} = \tau_{EC} = \tau_B + \tau_C + \tau_E + \tau_{CC} \quad (1)$$

respectively. The junction charging times consist of the emitter charging time, defined as $\tau_E = r_E * C_{JE}$, and the collector charging time, $\tau_{CC} = (r_E + R_{EE} + R_C) * C_{BC}$. The forward delay $\tau_F$, obtained from extrapolating the total delay, $\tau_{EC}$ vs. $1/I_C$ to $1/I_C = 0$ A$^{-1}$, is measured to be 204 fs, indicating a base and collector transit time of $\tau_B + \tau_C = 137$ fs. Comparing a similar HBT with a 75 nm collector and 25 nm base operating with $f_T = 509$ GHz (see W. Hafez, J. W. Lai and M. Feng, Elec. Lett. 39, No. 20, 1475 (2003)), a 16% reduction in total transit time $\tau_{EC}$ is observed, 7% of which is due to a reduction in the collector transit time, 5% from the base transit time, and 3% from the emitter charging time. The collector charging time is observed to have a negligible change from the 75 nm collector device (83 fs versus 86 fs for the 62.5 and 75 nm collectors, respectively), despite the thinner collector thickness; the increase in $C_{BC}$ from the thinner collector is offset by the increase in the operating current density, effectively keeping the charging time constant. The decrease in emitter charging time ($\Delta \tau_E = 10$ fs) is due to the low dynamic emitter resistance, also a benefit from the high current density operation. The transit time compromises roughly half of the total device delay, indicating parasitic capacitances ($C_{BC}$ primarily) have been adequately controlled through layout and processing techniques. The benefit obtained through the use of the 10% compositionally graded collector, in this example, is estimated to result in a 7% reduction in collector transit time compared with a lattice-matched collector of the same thickness, resulting in an average velocity in excess of $4.3 \times 10^7$ cm/s through the collector. The boost in the drift velocity is due to faster drift transport in the graded indium composition of InGaAs collector.

The above described embodiment was set forth in terms of an InP—InGaAs HBT which is seen to exhibit substantially improved characteristics including a frequency of operation at the leading edge of present technology. The principles hereof also have application to methods and devices using, for example, other Type I, as well as Type II and Type I/Type II HBTs. The following listing is non-limiting and refers to grading as a form of material composition transition, although it will be understood that any suitable continuous and/or discrete transitions can be utilized:

Type I HBT: Wide gap emitter with graded base, graded collector and graded sub-collector
  GaAs HBT: AlGaAs or GaAs or InGaP(Emitter)/InGaAs (graded-base)/InGaAs(graded-collector)/InGaAs (graded-sub-collector);
  GaN HBT: GaN (Emitter)/InGaN(graded-base)/InGaN (graded-collector)/InGaN(graded-sub-collector);
Type II HBT: Wide gap emitter with graded base, graded collector and graded sub-collector
  InGaP or InAlGaP or InP (Emitter)/GaAsSb(graded-base)/InGaAsSb or InGaP (graded-collector)/InGaAsSb(graded-sub-collector);
Type I/Type II HBT: Type I Wide gap emitter with graded base and with type II base to graded collector and graded sub-collector
  AlGaSb (emitter)/GaAsSb (base)/InP, InGaAs, InGaAsSb (collector).

Figure 8:
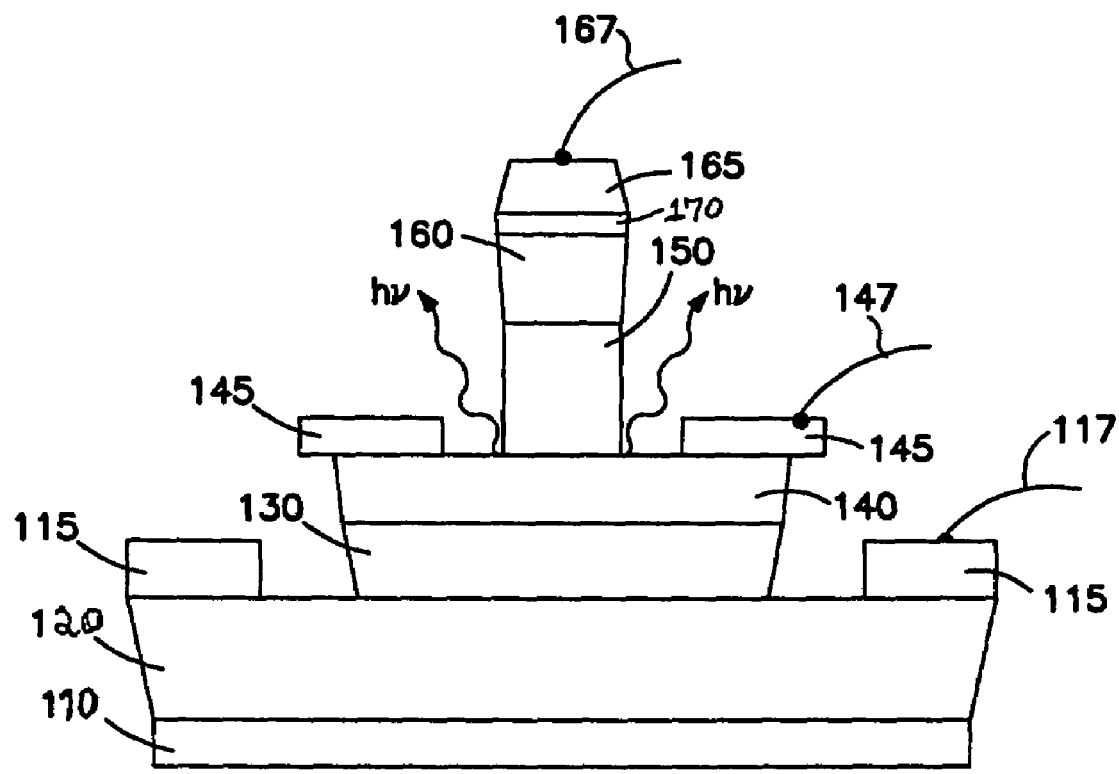
FIG. 8 is a simplified diagram, not to scale, of a light emitting pHBT in accordance with an embodiment of the invention.

FIG. 8 shows a light-emitting pHBT, using the improvements described hereinabove, and showing light emission from radiative recombination in the base region. The heterostructure has corresponding regions to those of FIG. 1, with like reference numerals, and also showing subcollector contact 115 and lead 117, base contact 145 and lead 147, and emitter contact 165 and lead 167.

The invention claimed is:

1. A method for making a heterojunction bipolar transistor, comprising the steps of:
   forming a heterojunction bipolar transistor by depositing, on a substrate, subcollector, collector, base, and emitter regions of semiconductor material;
   said step of depositing said subcollector region comprising depositing In$_x$Ga$_{1-x}$As having a relatively lower indium fraction nearer the substrate with transition to a relatively higher indium fraction adjacent the collector; and
   said step of depositing said collector region comprising depositing a material composition transition from a relatively smaller bandgap material adjacent the subcollector to a relatively larger bandgap material adjacent the base.

2. The method as defined by claim 1, wherein said step of depositing said collector region with material composition transition from a relatively smaller bandgap material adjacent the subcollector to a relatively larger bandgap material adjacent the base comprises depositing a graded composition of material.

3. The method as defined by claim 1, wherein said step of depositing said collector region with material composition transition from a relatively smaller bandgap material adjacent the subcollector to a relatively larger bandgap material adjacent the base comprises depositing a graded composition of material.

4. The method as defined by claim 1, wherein said step of depositing said collector region comprises depositing In$_x$Ga$_{1-x}$As having a relatively higher indium fraction adjacent the subcollector with transition to a relatively lower indium fraction adjacent the base.

5. The method as defined by claim 1, wherein said step of depositing said base region comprises depositing a material composition transition from a relatively smaller bandgap adjacent said collector to a relatively larger bandgap adjacent said emitter.

6. The method as defined by claim 1, wherein said step of depositing said base region comprises depositing In$_x$Ga$_{1-x}$As having a relatively higher indium fraction adjacent the collector with transition to a relatively lower indium fraction adjacent the emitter.

7. The method as defined by claim 1, wherein said emitter comprises InP graded to InAs.

8. A method for making a heterojunction bipolar transistor, comprising the steps of:
   forming a heterojunction bipolar transistor by depositing, on a substrate, subcollector, collector, base, and emitter regions of semiconductor material;
   said step of depositing said subcollector region comprising depositing a material composition transition from a relatively larger bandgap material nearer the substrate to a relatively smaller bandgap material adjacent the collector; and said step of depositing said collector region comprising depositing $In_xGa_{1-x}As$ having a relatively higher indium fraction adjacent the subcollector with transition to a relatively lower indium fraction adjacent the base.

9. The method as defined by claim 8, wherein said step of depositing said subcollector with material composition transition from a relatively larger bandgap material nearer the substrate to a relatively smaller bandgap material adjacent the collector comprises depositing a graded composition of material.

10. The method as defined by claim 8, wherein said step of depositing said subcollector with material composition transition from a relatively larger bandgap material nearer the substrate to a relatively smaller bandgap material adjacent the collector comprises depositing a stepped composition of material.

11. The method as defined by claim 8, wherein said substrate comprises InP and said step of depositing includes depositing said subcollector region as $In_xGa_{1-x}As$ on a heavily doped InP layer.

12. The method as defined by claim 8, wherein said step of depositing said base region comprises depositing a material composition transition from a relatively smaller bandgap adjacent said collector to a relatively larger bandgap adjacent said emitter.

13. The method as defined by claim 8, wherein said step of depositing said base region comprises depositing $In_xGa_{1-x}As$ having a relatively higher indium fraction adjacent the collector with transition to a relatively lower indium fraction adjacent the emitter.

14. The method as defined by claim 8, wherein said emitter comprises InP graded to InAs.

15. A method for making a heterojunction bipolar transistor, comprising the steps of:
    forming a heterojunction bipolar transistor by depositing subcollector; collector, base, and emitter regions of semiconductor material;
    said step of depositing said collector region comprising depositing $In_xGa_{1-x}As$ having a relatively higher indium fraction adjacent the subcollector with transition to a relatively lower indium fraction adjacent the base.

16. The method as defined by claim 15, wherein said transition comprises a graded transition.

17. The method as defined by claim 15, wherein said transition comprises a stepped transition.

18. The method as defined by claim 15, wherein said step of depositing includes depositing said subcollector region as InGaAs on an InP layer.

19. A method for making a heterojunction bipolar transistor, comprising the steps of:
    forming a heterojunction bipolar transistor by depositing, on a substrate, subcollector; collector, base, and emitter regions of semiconductor material;
    said step of depositing said subcollector region comprising depositing $In_xGa_{1-x}As$ having a relatively lower indium fraction nearer the substrate with transition to a relatively higher indium fraction adjacent the collector.

20. The method as defined by claim 19, wherein said transition comprises a graded transition.

21. The method as defined by claim 19, wherein said transition comprises a stepped transition.

* * * * *